(12) United States Patent
Hong et al.

(10) Patent No.: US 9,923,554 B2
(45) Date of Patent: Mar. 20, 2018

(54) WIRELESS POWER TRANSMITTER

(71) Applicants: SAMSUNG ELECTRO-MECHANICS CO., LTD., Suwon-si (KR); University of Seoul Industry Cooperation Foundation, Seoul (KR)

(72) Inventors: Byung Joo Hong, Suwon-si (KR); Je Hyuk Ryu, Suwon-si (KR); Hyung Gu Park, Seoul (KR); Joong Ho Choi, Seongnam-si (KR); Hong Jin Kim, Seoul (KR); Joo Young Lee, Incheon (KR); Dong Hyeon Seo, Incheon (KR); Young Jun Park, Suwon-si (KR); Jong Woo Lee, Suwon-si (KR); Kang Yoon Lee, Seoul (KR)

(73) Assignees: Samsung Electro-Mechanics Co., Ltd., Suwon-si (KR); University of Seoul Industry Cooperation Foundation, Seoul (KR)

( * ) Notice: Subject to any disclaimer, the term of this patent is extended or adjusted under 35 U.S.C. 154(b) by 0 days.

(21) Appl. No.: 15/196,524

(22) Filed: Jun. 29, 2016

(65) Prior Publication Data

US 2017/0118722 A1 Apr. 27, 2017

(30) Foreign Application Priority Data

Oct. 26, 2015 (KR) .......................... 10-2015-0148622

(51) Int. Cl.
*H03K 4/502* (2006.01)
*H04L 1/24* (2006.01)
*H04J 11/00* (2006.01)
*H03F 3/24* (2006.01)
*H03F 1/02* (2006.01)
*H03K 3/0231* (2006.01)
*H03K 3/84* (2006.01)

(52) U.S. Cl.
CPC ............. *H03K 4/502* (2013.01); *H03F 1/025* (2013.01); *H03F 3/245* (2013.01); *H03K 3/0231* (2013.01); *H04J 11/0023* (2013.01); *H04L 1/242* (2013.01); *H03F 2200/114* (2013.01); *H03K 3/84* (2013.01)

(58) Field of Classification Search
USPC .............. 455/41.1, 324, 196.1, 207, 255, 76
See application file for complete search history.

(56) References Cited

U.S. PATENT DOCUMENTS

| 2003/0058053 A1* | 3/2003 | Jeon ...................... H03C 3/0958 331/17 |
| 2009/0309784 A1* | 12/2009 | Natsume ............... G01S 13/426 342/189 |
| 2011/0260548 A1* | 10/2011 | Urano ..................... H02J 5/005 307/104 |

(Continued)

FOREIGN PATENT DOCUMENTS

| KR | 10-2015-0032529 A | 3/2015 |
| WO | WO 2014/007415 A1 | 1/2014 |

*Primary Examiner* — Ganiyu A Hanidu
(74) *Attorney, Agent, or Firm* — NSIP Law

(57) ABSTRACT

A wireless power transmitter includes an amplifier configured to amplify a power; a transmitter configured to resonate the power amplified by the amplifier; and a reference signal provider configured to provide a reference signal to the amplifier and change a frequency of the reference signal.

10 Claims, 4 Drawing Sheets

(56) References Cited

U.S. PATENT DOCUMENTS

| | | | |
|---|---|---|---|
| 2012/0280575 A1* | 11/2012 | Kim | H02J 17/00 307/104 |
| 2012/0307873 A1* | 12/2012 | Kim | H04B 5/0031 375/219 |
| 2012/0309304 A1* | 12/2012 | Kim | H04B 5/0031 455/41.1 |
| 2012/0309305 A1* | 12/2012 | Kim | H04B 5/0031 455/41.1 |
| 2015/0162785 A1* | 6/2015 | Lee | H02J 17/00 307/104 |

* cited by examiner

WIRELESS POWER TRANSMITTER

CROSS-REFERENCE TO RELATED APPLICATIONS

This application claims the benefit of Korean Patent Application No. 10-2015-0148622, filed on Oct. 26, 2015 in the Korean Intellectual Property Office, the entire disclosure of which is incorporated herein by reference for all purposes.

BACKGROUND

1. Field

The following description relates to a wireless power transmitter.

2. Description of Related Art

Wireless power transfer technology has been widely used in the field of chargers of various communications devices including smartphones and several home appliances, and is a technology having a significantly wide application field. In general, a wireless power transmitter for wireless power transfer may transmit a high degree of power as compared to a data transmission. The above-mentioned high degree of power may cause electro-magnetic interference (EMI) in other electronic devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to a general aspect, a wireless power transmitter includes an amplifier configured to amplify a power; a transmitter configured to resonate the power amplified by the amplifier; and a reference signal provider configured to provide a reference signal to the amplifier and change a frequency of the reference signal.

The transmitter may be further configured to overlap first power having a resonance frequency, second power having a frequency lower than the resonance frequency, and third power having a frequency higher than the resonance frequency with one another and wirelessly transmit the overlapping power, and the reference signal provider may be further configured to vary the frequency of the reference signal in a frequency range between the second power and the third power.

The reference signal provider may be further configured to determine the frequency of the second power and the frequency of the third power in the frequency range, so that deviation between maximum transmission power and minimum transmission power does not exceed about 10 dB.

The reference signal provider may be further configured to randomly select the frequency of the reference signal in the frequency range.

The reference signal provider may be further configured to generate a clock signal of which a frequency is varied, using a relaxation oscillator.

The reference signal provider may be further configured to generate a clock signal of which a frequency is irregularly varied by irregularly varying an operation current of the relaxation oscillator.

The reference signal provider further comprises a variable capacitor connected to an output terminal thereof, and the reference signal provider may be further configured to generate a clock signal of which a frequency is irregularly varied by irregularly varying output capacitance of the variable capacitor.

The wireless power transmitter may further include a power provider, the power provider including a step-up direct current (DC)-DC converter configured to provide the power to the amplifier; and a step-down DC-DC converter configured to provide operating power to the amplifier and the reference signal provider.

The wireless power transmitter may further include a communications circuit configured to generate and process a communications signal; and an antenna configured to transmit and receive the communications signal, wherein the power provider is configured to provide the power to the communications circuit and the antenna.

According to another general aspect, a wireless power transmitter includes a transmitter configured to wirelessly transmit power by a resonance; and a power supply configured to provide power of which a frequency is irregularly varied in a range between a first frequency which is lower than a resonance frequency and a second frequency which is higher than the resonance frequency to the transmitter.

The power supply may determine a frequency variable range of the power in the range of the first frequency or more and the second frequency or less, so that deviation between maximum transmission power and minimum transmission power does not exceed 10 dB.

The power supply may randomly select a frequency variable period and/or a frequency variable pattern of the power.

According to another general aspect, a method of wireless power transmission includes executing a reference signal provider to generate a reference signal; and, actuating an amplifier to receive the reference signal from the reference signal provider, and adaptively spread a wireless power transmission away from a substantially optimal resonance frequency for the transmission in response to the reference signal.

The method may further include actuating a communication circuit to identify an electromagnetic interference (EMI); and, adaptively spreading the wireless power transmission about a central resonance frequency in response to EMI detected in the communication circuit.

The adaptive spreading of the wireless power may be performed in substantially random or irregular manner in response to detected harmonic EMI.

A non-transitory computer-readable storage medium may store instructions for causing a processor to perform the method.

The power supply may be further configured to provide power of which the frequency is irregularly varied in the range.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
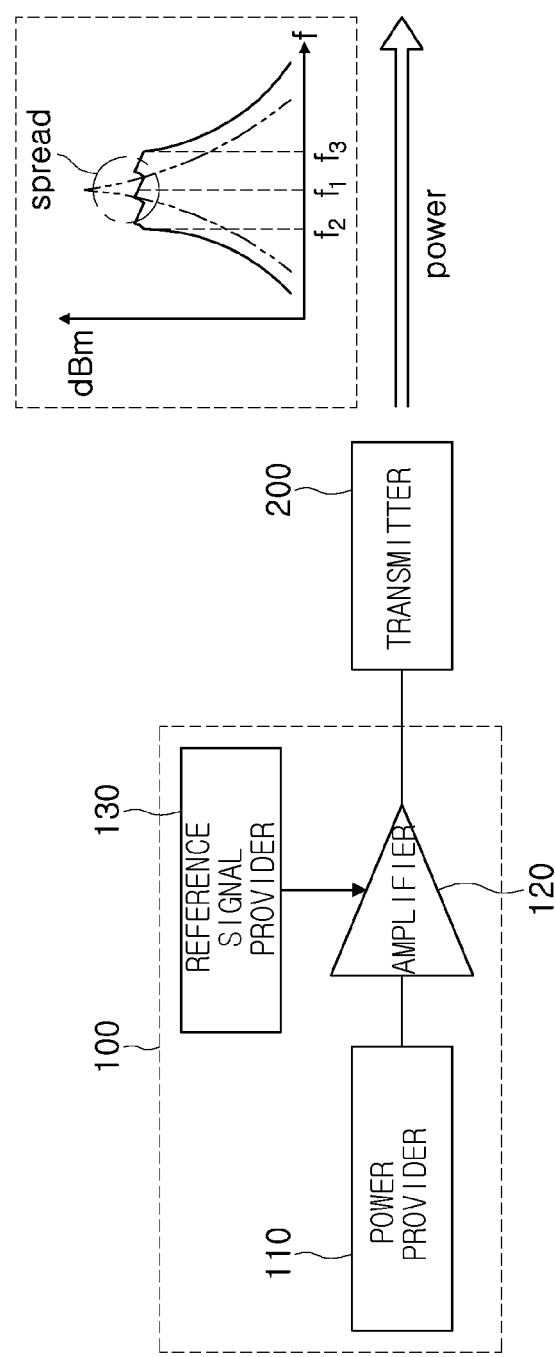
FIG. 1 is a diagram illustrating a wireless power transmitter according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" than the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be encountered. Thus, embodiments of the present disclosure should not be construed as being limited to the particular shapes of regions shown herein, but should be understood, for example, to include a change in shape resulting from manufacturing. The following embodiments may also be constituted by one or a combination thereof.

The contents of the present disclosure described below may have a variety of configurations, but are not limited thereto.

FIG. 1 is a diagram illustrating a wireless power transmitter according to an embodiment in the present disclosure.

Referring to FIG. 1, a wireless power transmitter according to an embodiment in the present disclosure includes a power supply 100 and a transmitter 200.

The power supply 100 may provide power in which a frequency is varied, for example, in the range of a frequency f2 (or more) which is lower than a resonance frequency f1, and a frequency f3 (or less) which is higher than the resonance frequency f1 to the transmitter 200. The transmitter 200 wirelessly transmits the power provided from the power supply 100 by a resonance manner. Because the frequency of the power is varied, a transmission power spectrum of the transmitter 200 is beneficially spread. That is, in the spectrum, transmission power at the resonance frequency f1 may be decreased, and transmission power at a frequency around the resonance frequency f1 may be increased. In other words, total transmission power, at frequencies surrounding the resonance frequency f1, is increased to deliver a greater amount of power.

In a case in which the power supply 100 includes elements having non-linear characteristics such as a semiconductor element, power of the resonance frequency f1 and a harmonic component of the power may be synthesized with each other to generate an additional harmonic component. The above-mentioned harmonic components may cause electro-magnetic interference in other electronic devices.

In a case in which magnitude of power of the resonance frequency f1 is great, magnitude of the harmonic component may also become great. Further, a magnitude increase rate of the power of the harmonic component may be a degree or more times greater than a magnitude increase rate of the power of the resonance frequency f1. For example, the magnitude increase rate of power of a 3rd harmonic component may be 3 times of the magnitude increase rate of the power of resonance frequency f1.

Similarly, in a case in which the magnitude of the power of the resonance frequency f1 is decreased, the magnitude of the harmonic component may be likewise decreased. Therefore, the transmission power spectrum of the transmitter 200 is spread, and thus the magnitude of the harmonic component may be further decreased. As a result, the wireless power transmitter according to an embodiment reduces electro-magnetic interference (EMI).

In addition, a harmonic component having a frequency which is close to a frequency of a fundamental wave component may also be included in the harmonic components. It may be difficult to remove the harmonic component by amplification, filtration, matching, and the like in the power supply 100. However, the wireless power transmitter according to an embodiment may further reduce electro-magnetic interference by removing the harmonic component.

Therefore, the wireless power transmitter according to an embodiment reduces electro-magnetic interference by efficiently removing the harmonic component even though transmission power is not reduced.

Referring to FIG. 1, the power supply 100 includes a power provider 110, an amplifier 120, and a reference signal provider 130.

The power provider 110 may provide power. For example, the power provider 110 may be supplied with energy from a battery or a power system, and generate the power using a converter or an inverter to provide the generated power to the amplifier 120.

The amplifier 120 may amplify the power. For example, the amplifier 120 may include a power amplifier and a driver amplifier that amplify power having a high frequency and having great magnitude at high efficiency.

The reference signal provider 130 provides a reference signal of which a frequency is varied to the amplifier 120. The reference signal serves as an operational reference for an element such as a switch included in the amplifier 120. The frequency of the power amplified by the amplifier 120 may be affected by an operation frequency of the element such as the switch. Therefore, in a case in which the frequency of the reference signal is varied, the frequency of the power may also be varied.

For example, the reference signal provider 130 may vary the frequency of the reference signal in the range of the frequency f2 or more which is lower than the resonance frequency f1 and the frequency f3 or less which is higher than the resonance frequency f1. Accordingly, a frequency spectrum of the power amplified by the amplifier 120 may be spread.

For example, the reference signal provider 130 may determine a frequency variable range of the reference signal in the range of the frequency f2 or more which is lower than the resonance frequency f1 and the frequency f3 or less which is higher than the resonance frequency f1, so that deviation between maximum transmission power and minimum transmission power does not exceed, for example, about 10 dB. The deviation of 10 dB may be varied depending on an application standard of wireless power transmission.

If the frequency variable range of the reference signal is very wide, power having very small magnitude to be wirelessly transmitted may occur among powers within the frequency variable range. That is, a difference between power of a valley and power of a peak in a zigzag shape of a spectrum within the frequency variable range may be too large. In this case, it may be difficult for a power receiver to detect transmitted power. That is, stability of the wireless power transmission may be decreased.

If the frequency variable range of the reference signal is very narrow, magnitude of the power of the resonance frequency f1 may become very large. Accordingly, electro-magnetic interference may occur.

The reference signal provider 130 may randomly select the frequency of the reference signal in the range of the frequency f2 or more which is lower than the resonance frequency f1 and the frequency f3 or less which is higher than the resonance frequency f1. In a case in which the frequency of the reference signal is selected according to a predetermined pattern, additional noise according to the pattern may occur. Therefore, the reference signal provider 130 may reduce such additional noise by randomly selecting the frequency of the reference signal. As a result, the wireless power transmitter according to an embodiment may reduce electro-magnetic interference in a wide frequency range. Further description related to the additional noise will be provided below with reference to FIG. 3.

Figure 2:
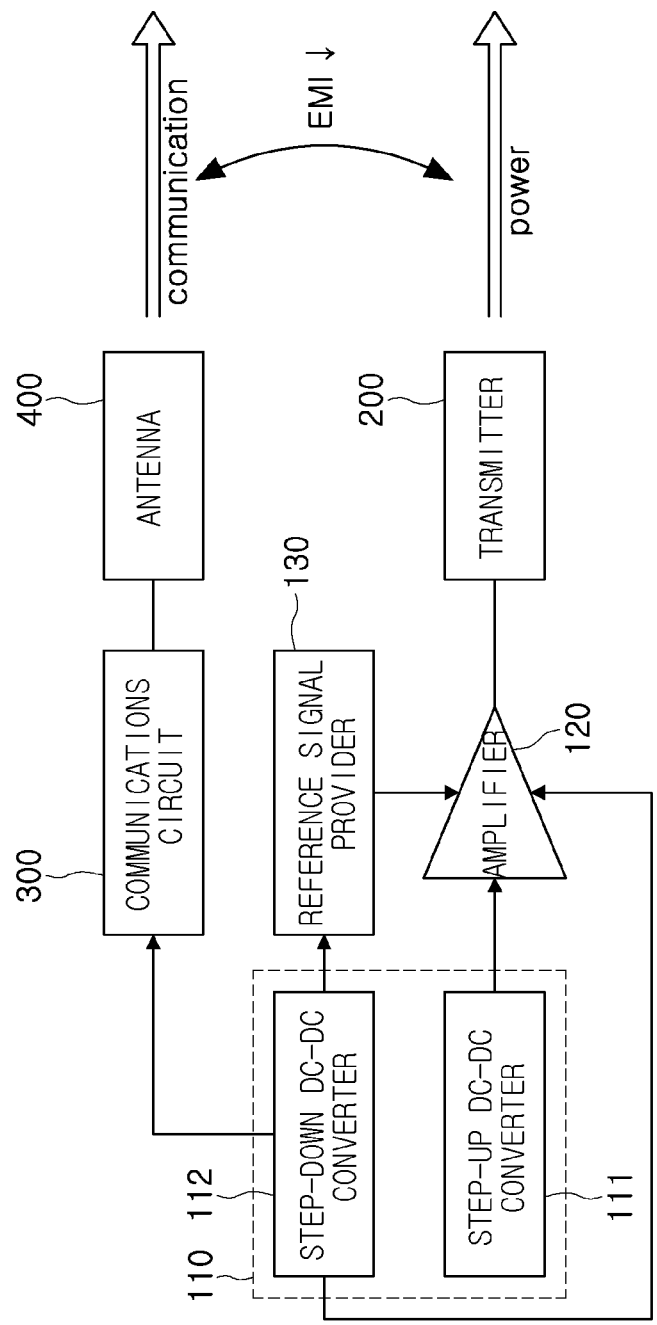
FIG. 2 is a diagram illustrating a wireless power transmitter according to an embodiment.

FIG. 2 is a diagram illustrating a wireless power transmitter according to an embodiment.

Referring to FIG. 2, the wireless power transmitter according to an embodiment further includes a communications circuit 300 and an antenna 400.

The communications circuit 300 generates and processes a communications signal. For example, the communications signal may be a signal of a communications standard such as a cellular signal or Wi-Fi.

The antenna 400 transmits and receives the communications signal. That is, the wireless power transmitter according to an embodiment performs data communications together with the wireless power transmission.

In general, the power transmitted from the transmitter 200 may cause electro-magnetic interference (EMI) in the communications circuit 300 and the antenna 400. However, the wireless power transmitter according to an embodiment may reduce electro-magnetic interference (EMI) caused in the communications circuit 300 and the antenna 400 by spreading the transmission power spectrum of the transmitter 200.

Meanwhile, the communications circuit 300 and the antenna 400 may be supplied with operating power from the power provider 110.

Referring to FIG. 2, the power provider 110 includes a step-up direct current (DC)-DC converter 111 and a step-down DC-DC converter 112.

The step-up DC-DC converter 111 generates power which is wirelessly transmitted by increasing a voltage of power received from a battery or a power system, and provides the generated power to the amplifier 120.

The step-down DC-DC converter 112 generates the operating power by decreasing the voltage of the power received from the battery or the power system, and provides the generated operation power to the amplifier 120, the reference signal provider 130, the communications circuit 300, and the antenna 400 according to an embodiment.

That is, the power provider 110 may provide the power for operating the wireless power transmitter as well as the power which is wirelessly transmitted.

Figure 3:
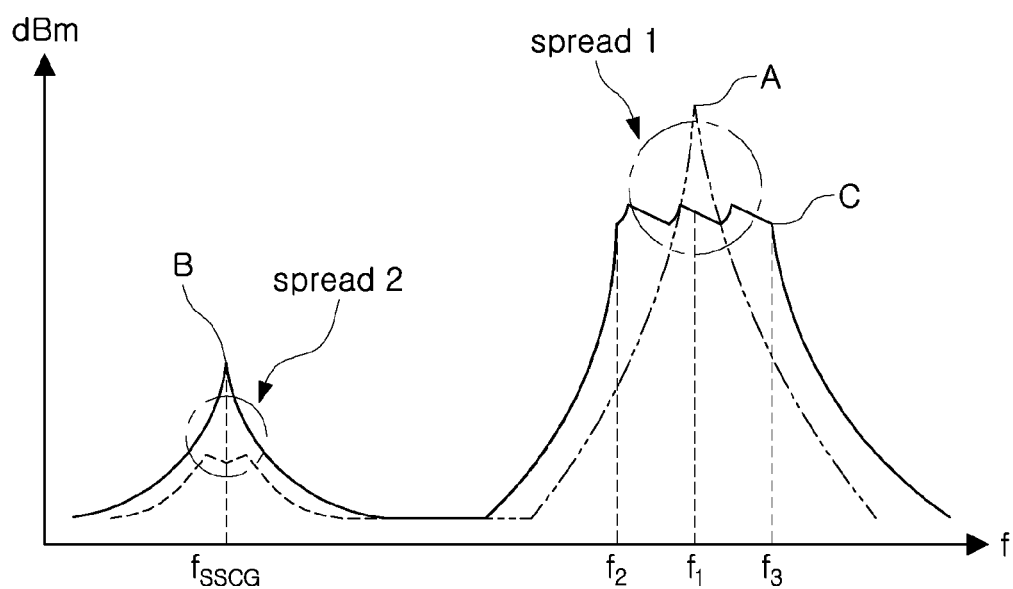
FIG. 3 is a diagram illustrating a reduction of electromagnetic interference (EMI) of the wireless power transmitter according to an embodiment.

FIG. 3 is a diagram illustrating a reduction of electro-magnetic interference (EMI) of the wireless power transmitter of FIG. 2.

Referring to FIG. 3, a curve A illustrates a transmission power spectrum of a case in which a primary spread (spread 1) is not performed for the transmission power spectrum, a curve B illustrates a transmission power spectrum of a case in which the primary spread (spread 1) is performed for the transmission power spectrum and a secondary spread (spread 2) is not performed for the transmission power spectrum, and a curve C illustrates a transmission power spectrum of a case in which the primary spread (spread 1) is performed for the transmission power spectrum and the secondary spread (spread 2) is performed for the transmission power spectrum.

In the case in which the primary spread (spread 1) is not performed for the transmission power spectrum, as a frequency of transmission power is close to the resonance frequency f1, the transmission power may be increased. In a case in which a difference between the frequency of the transmission power and the resonance frequency f1 is close to 0, the transmission power may be close to infinite (if ideal, not actual, components are assumed). The above-mentioned characteristics may be applied to a resonance type wireless power transmitter regardless of magnitude of the power amplified by the amplifier. However, the wireless power transmitter according to an embodiment is configured to prevent an occurrence of the above-mentioned characteristics by spreading the transmission power spectrum.

By the primary spread (spread 1), the transmission power at the resonance frequency f1 is decreased, and the transmission power at the frequency f2 lower than the resonance frequency and the frequency f3 higher than the resonance frequency are increased. Accordingly, since power of the harmonic component is decreased, electro-magnetic interference is reduced.

In a case in which the primary spread (spread 1) is performed at a predetermined period, noise may occur at a specific frequency $F_{SSCG}$. The noise may cause electromagnetic interference (EMI).

The noise may be dispersed into adjacent frequencies by the secondary spread (spread 2). Accordingly, electro-magnetic interference (EMI) may be further reduced.

For example, the primary spread (spread 1) may be performed by varying the frequency of the reference signal of the wireless power transmitter according to an embodiment, and the secondary spread (spread 2) may be performed by irregularly varying the frequency of the reference signal.

Figure 4:
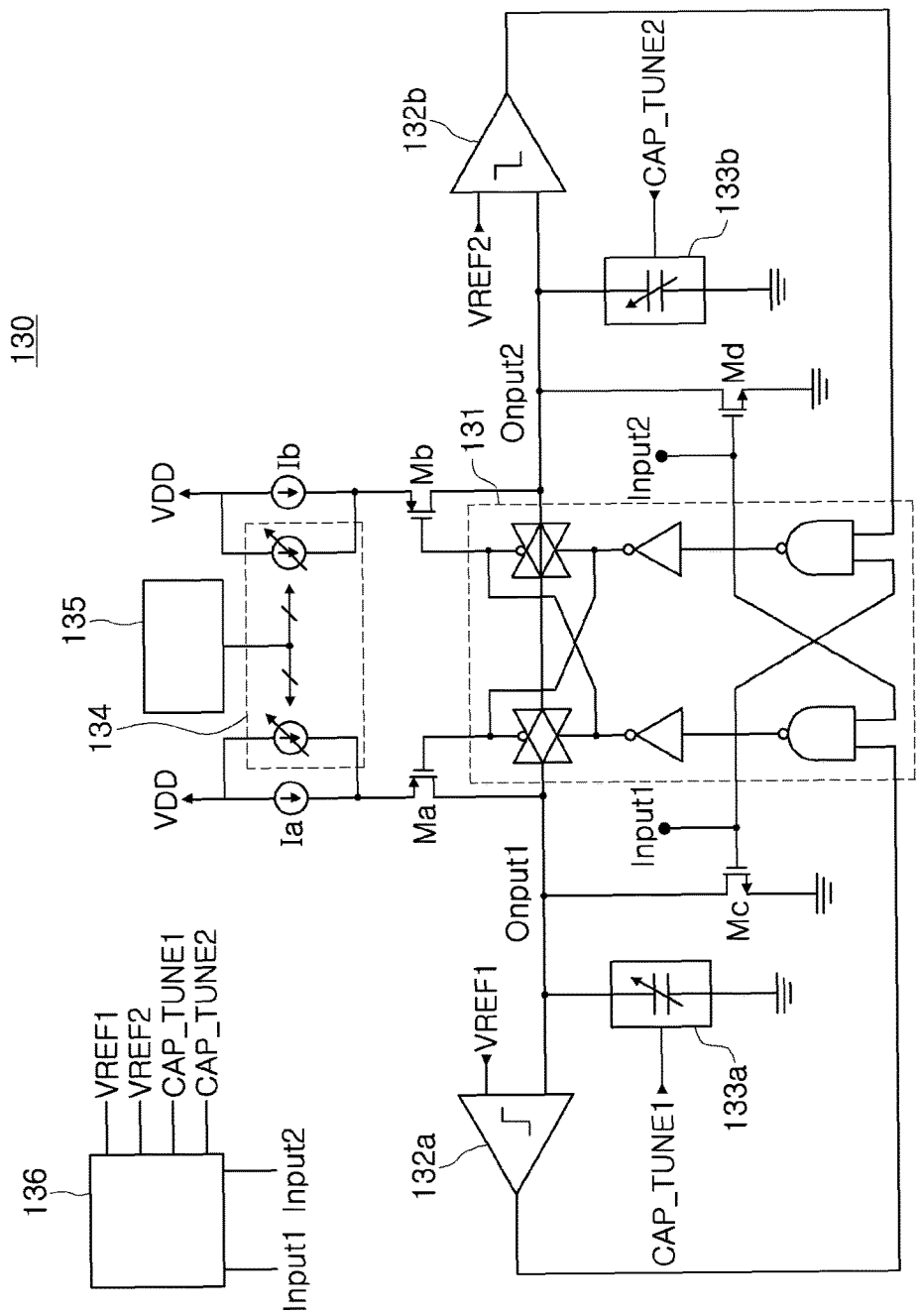
FIG. 4 is a diagram illustrating a reference signal provider according to an embodiment.

FIG. 4 is a diagram illustrating the reference signal provider of FIG. 1 in detail.

Referring to FIG. 4, according to an embodiment, the reference signal provider 130 includes a latch circuit 131, comparators 132a and 132b, variable capacitors 133a and 133b, a variable current source 134, a substantially random or pseudorandom selection circuit such as a random number generator 135, and a controller 136.

Here, the latch circuit 131 and the comparators 132a and 132b serve as a relaxation oscillator. The relaxation oscillator generates an oscillation signal by charging and discharging the variable capacitors 133a and 133b around a threshold voltage defined internally by a circuit. As such, the relaxation oscillator may output an oscillation frequency having a period determined according to a charge and discharge time of the variable capacitors 133a and 133b, by repetitively performing an operation of charging the variable capacitors 133a and 133b, and an operation of discharging the variable capacitors 133a and 133b when a voltage across the variable capacitors 133a and 133b reaches a level of the threshold voltage.

The latch circuit 131 may each delay voltages output from the comparators 132a and 132b, and output clock signals Output1 and Output2. Further, the latch circuit 131 may output input signals Input1 and Input2.

The comparators 132a and 132b compare an output signal of the latch circuit 131 with reference voltages VREF1 and VREF2 with each other, and may output a voltage according to the comparison result. For example, the comparators 132a and 132b may be Schmitt triggers.

The variable capacitors 133a and 133b are applied with capacitance control signals CAP_TUNE1 and CAP_TUNE2 and may have variable capacitances. Frequencies of the clock signals Output1 and Output2 may be varied according to the capacitances.

The variable current source 134 may be applied with a control signal from the random number generator 135, and may output a variable current. The frequencies of the clock signals Output1 and Output2 may be varied according to the variable current.

The random number generator 135 may randomly select the current output from the variable current source 134. For example, the random number generator 135 may randomly select a variable period/duty-cycle of the current and/or a variable pattern of the current. For example, the random number generator 135 may generate a pseudo-random code, and may transfer the generated pseudo-random code to the variable current source 134 or the variable capacitors 133a and 133b.

The controller 136 controls the reference signal provider 130.

The reference signal provider 130 further includes a plurality of transistors Ma, Mb, Mc, and Md, and fixed current sources Ia and Ib.

The apparatuses, units, modules, devices, controllers, random number generators, and other components illustrated in FIGS. 1-2 and 4 that perform the operations described herein with respect to FIGS. 1 and 3-4 are implemented by hardware components. Examples of hardware components include controllers, sensors, generators, drivers, and any other electronic components known to one of ordinary skill in the art. In one example, the hardware components are implemented by one or more processors or computers. A processor or computer is implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices known to one of ordinary skill in the art that is capable of responding to and executing instructions in a defined manner to achieve a desired result. In one example, a processor or computer includes, or is connected to, one or more memories storing instructions or software that are executed by the processor or computer. Hardware components implemented by a processor or computer execute instructions or software, such as an operating system (OS) and one or more software applications that run on the OS, to perform the operations described herein with respect to FIGS. 1 and 3-4. The hardware components also access, manipulate, process, create, and store data in response to execution of the instructions or software. For simplicity, the singular term "processor" or "computer" may be used in the description of the examples described herein, but in other examples multiple processors or computers are used, or a processor or computer includes multiple processing elements, or multiple types of processing elements, or both. In one example, a hardware component includes multiple processors, and in another example, a hardware component includes a processor and a controller. A hardware component has any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1 and 3-4 that perform the operations described herein may be performed by a processor or a computer as described above executing instructions or software to perform the operations described herein.

Instructions or software to control a processor or computer to implement the hardware components and perform the methods as described above are written as computer programs, code segments, instructions or any combination thereof, for individually or collectively instructing or configuring the processor or computer to operate as a machine or special-purpose computer to perform the operations performed by the hardware components and the methods as described above. In one example, the instructions or software include machine code that is directly executed by the processor or computer, such as machine code produced by a compiler. In another example, the instructions or software include higher-level code that is executed by the processor or computer using an interpreter. Programmers of ordinary skill in the art, after gaining a thorough understanding of the present disclosure, can readily write the instructions or software based on the block diagrams and the flow charts illustrated in the drawings and the corresponding descriptions in the specification, which disclose algorithms for performing the operations performed by the hardware components and the methods as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any device known to one of ordinary skill in the art that is capable of storing the instructions or software and any associated data, data files, and data structures in a non-transitory manner and providing the instructions or software and any associated data, data files, and data structures to a processor or computer so that the processor or computer can execute the instructions. In one example, the instructions or software and any associated data, data files, and data structures are distributed over network-coupled computer systems so that the instructions and software and any associated data, data files, and data structures are stored, accessed, and executed in a distributed fashion by the processor or computer. As set forth above, according to the embodiments, the wireless power transmitter may reduce electro-magnetic interference (EMI). Further, since the wireless power transmitter according to an embodiment may reduce electro-magnetic interference (EMI) even though it does not include the EMI filter, a size and costs thereof may be decreased, and EMI may be reduced in a wide frequency range.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A wireless power transmitter comprising:
an amplifier configured to amplify a power;
a transmitter configured to resonate the power amplified by the amplifier; and
a reference signal provider configured to provide a reference signal to the amplifier and to randomly change a frequency of the reference signal
wherein the reference signal provider randomly changing the frequency comprises providing a clock signal of which a frequency is irregularly varied, and
wherein the reference signal provider is further configured to generate the clock signal of which the frequency is irregularly varied by irregularly varying an operation current of a relaxation oscillator.

2. The wireless power transmitter of claim 1, wherein the transmitter is further configured to overlap first power having a resonance frequency, second power having a frequency lower than the resonance frequency, and third power having a frequency higher than the resonance frequency with one another and to wirelessly transmit the overlapping power, and
the reference signal provider is further configured to vary the frequency of the reference signal in a frequency range between the second power and the third power.

3. The wireless power transmitter of claim 2, wherein the reference signal provider is further configured to determine the frequency of the second power and the frequency of the third power in the frequency range, so that deviation between maximum transmission power and minimum transmission power does not exceed about 10 dB.

4. The wireless power transmitter of claim 1, wherein the reference signal provider randomly changing the frequency comprises randomly selecting the frequency of the reference signal in the frequency range.

5. A wireless power transmitter comprising:
an amplifier configured to amplify a power;
a transmitter configured to resonate the power amplified by the amplifier; and
a reference signal provider configured to provide a reference signal to the amplifier and to randomly change a frequency of the reference signal
wherein the reference signal provider randomly changing the frequency comprises providing a clock signal of which a frequency is irregularly varied, and
wherein the reference signal provider further comprises a variable capacitor connected to an output terminal thereof, and
the reference signal provider is further configured to generate the clock signal of which the frequency is irregularly varied by irregularly varying output capacitance of the variable capacitor.

6. The wireless power transmitter of claim 1, further comprising a power provider, the power provider comprising:
- a step-up direct current (DC)-DC converter configured to provide the power to the amplifier; and
- a step-down DC-DC converter configured to provide operating power to the amplifier and the reference signal provider.

7. The wireless power transmitter of claim 1, further comprising:
- a communications circuit configured to generate and process a communications signal; and
- an antenna configured to transmit and receive the communications signal,
- wherein the power provider is configured to provide the power to the communications circuit and the antenna.

8. A wireless power transmitter comprising:
- a transmitter configured to wirelessly transmit power by a resonance; and
- a power supply configured to provide power of which a frequency is randomly varied in a range between a first frequency which is lower than a resonance frequency and a second frequency which is higher than the resonance frequency to the transmitter,
- wherein the power supply is further configured to provide power of which the frequency is irregularly varied in the range.

9. The wireless power transmitter of claim 8, wherein the power supply determines a frequency variable range of the power in the range of the first frequency or more and the second frequency or less, so that deviation between maximum transmission power and minimum transmission power does not exceed 10 dB.

10. The wireless power transmitter of claim 8, wherein the power supply randomly selects a frequency variable period and/or a frequency variable pattern of the power.

* * * * *